United States Patent
Shiota et al.

(12)

(10) Patent No.: US 6,190,833 B1
(45) Date of Patent: Feb. 20, 2001

(54) RADIATION-SENSITIVE RESIN COMPOSITION

(75) Inventors: Atsushi Shiota; Masako Suzuki; Hozumi Sato, all of Tokyo (JP)

(73) Assignee: JSR Corporation, Tokyo (JP)

( * ) Notice: Under 35 U.S.C. 154(b), the term of this patent shall be extended for 0 days.

(21) Appl. No.: 09/163,008

(22) Filed: Sep. 30, 1998

(30) Foreign Application Priority Data

Mar. 30, 1997 (JP) .................................... 9-282694
Apr. 28, 1998 (JP) .................................... 10-119019

(51) Int. Cl.[7] ............................ G03F 7/029; G03F 7/004
(52) U.S. Cl. .................................... 430/280.1; 430/270.1; 430/288.1; 430/192; 522/51; 522/63
(58) Field of Search .................... 522/51, 63; 430/192, 430/270.1, 288.1, 280.1

(56) References Cited

U.S. PATENT DOCUMENTS

| | | | | |
|---|---|---|---|---|
| 4,142,018 | * | 2/1979 | Ozawa et al. | 428/323 |
| 4,356,277 | * | 10/1982 | Birkmeyer | 523/406 |
| 5,432,039 | * | 7/1995 | Shimokawa et al. | 430/191 |
| 5,494,777 | * | 2/1996 | Shiraki et al. | 430/270.1 |
| 5,541,036 | * | 7/1996 | Igawa et al. | 430/270.1 |
| 5,866,299 | * | 2/1999 | Szmanda et al. | 430/281.1 |
| 5,910,394 | * | 6/1999 | Shelnut | 430/280.1 |

FOREIGN PATENT DOCUMENTS

| | | | |
|---|---|---|---|
| 0 502 382 A1 | * | 9/1992 | (EP) . |
| 0 621 509 A1 | * | 10/1994 | (EP) . |
| 5-98043 | * | 4/1993 | (JP) . |
| 6-59444 | * | 3/1994 | (JP) . |
| 6-118646 | * | 4/1994 | (JP) . |

OTHER PUBLICATIONS

Registry No. 9003–08–1, Registry File on STN Service of ACS, 1999, Two Pages, 1999.*
Database WPI, Derwent Publications, AN 92–301713, JP 05–273753, Oct. 22, 1993.
Manfred Sander, Chem. Rev. 66, pp. 297, and 302 to 317, Table 1, "Thiiranes", 1996.

* cited by examiner

*Primary Examiner*—Cynthia Hamilton
(74) *Attorney, Agent, or Firm*—Oblon, Spivak, McClelland, Maier & Neustadt, P.C.

(57) ABSTRACT

A radiation-sensitive resin composition comprising: (A) a phenol resin, (B) an amino resin, (C) a compound having two or more crosslinking groups in a molecule, and (D) a halomethyl-1,3,5-triazine compound. The composition can form insulating layers exhibiting high resolution, high plating solution resistance, high adhesion to conductor wiring, and developability using an alkaline aqueous solution, producing cured insulating layers with superior solvent resistance, excellent waterproofing characteristics, and high heat resistance. The composition is useful for fabricating multilayered wiring boards.

8 Claims, No Drawings

RADIATION-SENSITIVE RESIN COMPOSITION

BACKGROUND OF THE INVENTION

1. Field of the Invention

The present invention relates to a radiation-sensitive resin composition. More particularly, the present invention relates to a radiation-sensitive resin composition suitable as a material for forming an insulating layer interposed between two integrally laminated sets of conductor wiring in the manufacture of multilayered wiring boards.

2. Prior Art

In recent years, a multilayered wiring board consisting of a number of laminated wiring boards with conductor wiring thereon via insulating layers has become more important in accordance with an increasing demand for a printed wiring board having higher circuit density. As a method for manufacturing such a multilayered wiring board, a method of repeatedly forming an insulating layer on the surface of a wiring board with conductor wiring formed thereon and forming additional conductor wiring electrically conducted to said conductor wiring on said insulating layer (this method may be called a "laminating method") has been proposed. A method which has been proposed to electrically connect two sets of conductor wiring laminated via an insulating layer in this laminating method comprises forming through-holes (holes drilled through an insulating layer) and plating the inner wall surfaces of these through-holes in the same manner as in a laminate-press method. Another method comprises forming drilled holes called via-holes which penetrate specified insulating layers and plating the inner wall surfaces of these via-holes.

As a method for forming these through-holes or via-holes through the insulating layers, a method of using an excimer laser, a method of etching the insulating layers via specified resist patterns by using an appropriate solvent, and the like have conventionally been proposed. In view of productivity, however, these methods were insufficient because a number of holes could not be formed at the same time, or many steps were involved in the production. Moreover, these methods were not satisfactory in view of accuracy of fabrication.

In order to overcome the above problems, a method of using a radiation-sensitive resin composition as a material for forming insulating layers interposed between sets of conductor wiring and forming through-holes on the insulating layers by photolithography has been proposed. According to this method, a number of through-holes can be formed at the same time, thereby ensuring high productivity in the manufacture of multilayered wiring boards. Moreover, since these through-holes can be formed with higher accuracy in comparison with conventional methods, this method is suitably employed in the manufacture of multilayered wiring boards having a minute wiring pattern. The holes formed on the insulating layers formed from a radiation-sensitive resin composition are provided with an electrical path by plating. These holes are called photo-via-holes.

Japanese Patent Application Laid-open No. 273753/1993 has proposed an example of forming an insulating layer by using a phenol resin, amino resin, epoxy resin, and onium salt as the radiation-sensitive resin composition.

Because the laminating method uses a radiation-sensitive resin composition as a material for forming an insulating layer in the manufacture of multilayered wiring boards, this method ensures fabrication of a multilayered laminated structure without using a pressing process and formation of photo-via-holes having a small diameter with high accuracy by photolithography. The laminating method is thus suitable for manufacturing multilayered wiring boards having a minute wiring pattern.

In the manufacture of multilayered wiring boards according to the laminating method, the following properties are required for the radiation-sensitive resin composition used for forming insulating layers:

(1) The resulting insulating layers must exhibit high resolution, whereby photo-via-holes with a small diameter corresponding to minute wiring patterns can be formed with high accuracy and high density;

(2) The resulting insulating layers must exhibit excellent resistance to plating solutions (plating solution resistance) such as an electroless copper plating solution used for forming conductor wiring. Moreover, the resulting insulating layers are required to have superior solvent resistance and excellent waterproofing characteristics after curing;

(3) The surfaces of the resulting insulating layers must exhibit high adhesion to conductor wiring formed by, for example, an electroless copper plating. Here, it is advantageous to roughen the surface of the insulating layer to increase adhesion of the conductor wiring formed on the surface by copper plating. The conductor wiring can be formed on the surface of the insulating layer with higher adhesion by the anchor effect of the roughened surface;

(4) The resulting insulating layers be developed by an alkaline aqueous solution. Undesirable effects on human body or environment can be avoided by using an alkaline aqueous solution as a developer for forming photo-via-holes; and (5) The resulting insulating layers must exhibit high electrical insulation, which gives rise to high reliability in electrical insulation of the composition, and excellent heat resistance after curing. These properties can ensure the use of the composition for the manufacture of electronic devices which have become smaller and lighter.

However, no conventional radiation-sensitive resin compositions can form insulating layers, while concurrently satisfying the above-described properties.

For example, an insulating layer formed from the radiation-sensitive resin composition disclosed in Japanese Patent Application Laid-open No. 273753/1993 exhibited high alkali developability, high resolution, superior adhesion of conductor wiring by copper plating, and the like. However, it has been pointed out that long-term reliability in electrical insulation of such an insulating layer was adversely affected by an onium salt used as a photoacid generator to a considerable degree.

Accordingly, an object of the present invention is to provide a radiation-sensitive resin composition capable of forming insulating layers exhibiting high resolution, high plating solution resistance, high adhesion to conductor wiring, and developability using an alkaline aqueous solution, producing cured insulating layers with superior solvent resistance, excellent waterproofing characteristics, and high heat resistance. The radiation-sensitive resin composition can produce multilayered wiring boards having high electrical insulation reliability with high efficiency.

SUMMARY OF THE INVENTION

The present inventors have undertaken extensive studies for solving the above-described problems in the prior arts and found that the above objects can be achieved by a radiation-sensitive resin composition comprising:

(A) a phenol resin, (B) an amino resin, (C) a compound having two or more crosslinking groups in a molecule, and (D) a halomethyl-1,3,5-triazine compound.

In particular, the present inventors found that reliability in electrical insulation after curing can be remarkably increased by blending the halomethyl-1,3,5-triazine compound (D) as a radiation active compound with the components (A)–(C).

Other and further objects, features and advantages of the present invention will appear more fully from the following description.

DETAILED DESCRIPTION OF THE INVENTION AND PREFERRED EMBODIMENTS

In the present invention, "radiation" includes infrared light, visible rays, ultraviolet light, X-rays, electron beams, α-rays, β-rays, γ-rays, and the like.

The radiation-sensitive resin composition of the present invention will now be described in detail.

When the radiation-sensitive resin composition of the present invention is exposed to radiation, the halomethyl-1,3,5-triazine compound (D) generates a free acid which functions as a curing catalyst and, with optional heating at 80–120° C., a crosslinking reaction between the phenol resin (A) and the amino resin (B) is initiated. At the same time, a cationic polymerization of the compound (C) having two or more crosslinking groups is effected, whereby the exposed area is cured. This produces a latent pattern which consists of an exposed area and an unexposed area, each having a different solubility to an alkaline developer from the other. After developing this latent pattern, the composition is cured at a temperature of 120° C. or more to initiate a crosslinking reaction of the phenol resin (A) and the unreacted compound of the component (C) having crosslinking groups, whereby cured products exhibiting high resistance to chemicals such as plating solutions and solvents, superior waterproofing characteristics, and high heat resistance can be obtained.

Component (A)

The phenol resin used as the component (A) is a polymer having phenolic hydroxyl groups such as a phenol group or a xylenol group in a molecule. This component is used as a base polymer. Polyvinylphenols, novolak resins, and the like can be given as examples of such a phenol resin. As specific examples of the polyvinylphenols, polyvinylphenol obtained by polymerizing a vinylphenol monomer by using a conventional method, polyvinylphenol obtained by polymerizing a vinylphenol monomer while protecting the phenolic hydroxyl group by protective groups, followed by removal of said protective group, and the like can be given. Moreover, various substituted polyvinylphenols obtained by polymerizing a monomer in which various substituents are introduced to a vinylphenol monomer, for example, vinylcresol, 2,4-dimethylvinylphenol, fluorinated vinylphenol, chlorinated vinylphenol, and brominated vinylphenol can also be used.

There are no specific limitations to the molecular weight of the polyvinylphenol. However, in view of resolution, developability, and plating solution resistance of the resulting insulating layers, it is preferable that the weight average molecular weight of the polyvinylphenol be 2,000 or more, in particular, 2,000–40,000.

Novolak resins are obtained by, for example, the addition condensation of aromatic compounds having a phenolic hydroxyl group (hereinafter called "phenols") and aldehydes preferably in a ratio of 1 mol to 0.7–1 mol by using acid catalysts. As specific examples of the phenols used for preparing novolak resins, phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 3,6-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol A, gallic acid, gallic acid ester, α-naphthol, β-naphthol, and the like can be given.

As specific examples of aldehydes, formaldehyde, paraformaldehyde, furfural, benzaldehyde, nitrobenzaldehyde, acetaldehyde, and the like can be given. As acid catalysts, hydrochloric acid, nitric acid, sulfuric acid, formic acid, oxalic acid, acetic acid, and the can be used.

The weight average molecular weight of the above novolak resin should be 200 or more, and preferably 400–2,000, in view of resolution, developability, and plating solution resistance of the resulting insulating layers.

The proportion of the component (A) used in the composition of the present invention is in a range whereby the insulating layers exhibit sufficient alkali-solubility.

Specifically, the proportion of the component (A) is usually 30–75 wt %, and preferably 40–70 wt %, of the total amount of the components (A)–(C) If the proportion is too small, the unexposed area of the resulting insulating layers may exhibit insufficient developability in an alkaline aqueous solution. On the other hand, if the proportion is too large, since the proportions of other components relatively decrease, the unexposed area of the resulting insulating layers may exhibit insufficient toughness, decreased heat resistance, and low plating solution resistance.

Component (B)

The amino resin used as the component (B) has two or more active methylol groups in a molecule. The component (B) acts as a curing agent which reacts with the alkali-soluble phenol resin (A) to form a crosslinking structure.

As examples of such amino resins, nitrogen-containing compounds having two or more active methylol groups in a molecule, for example, (poly)methylolmelamine, (poly)methylolglycoluril, (poly)methylolbenzoguanamine, and (poly)methylolurea; a compound in which a hydrogen atom in a hydroxyl group of a methylol group in the above nitrogen-containing compounds is replaced by an alkyl group such as a methyl group or a butyl group; and a compound containing a partial self-condensation oligomer of the above nitrogen-containing compounds or the above substituted compounds of the nitrogen-containing compounds can be given. These amino resins can be used either individually or in combinations of two or more.

As commercially available products of these amino resins, products of a Cymel series such as Cymel 300 (hexamethoxymethylmelamine) and Cymel 1170 (tetrabutoxymethylglycoluril), products of a Mycoat series, products of an UFR series (above, manufactured by Mitsui Cyanamid Co., Ltd.), and the like can be given. Of these, Cymel 300 (hexamethoxymethylmelamine) is preferable.

The component (B) is used in a proportion whereby the resulting insulating layers are sufficiently cured by a photopolymerization initiator and heat. Specifically, the proportion of the component (B) is 10–60 parts by weight, and preferably 15–50 parts by weight, for 100 parts by weight of the component (A). If the proportion is too small, the resulting insulating layers may exhibit insufficient toughness, low heat resistance, and inferior plating solution resistance. On the other hand, if the proportion is too large, thin films formed from the composition may exhibit insufficient developability.

Component (C)

The component (C) is a compound having two or more crosslinking groups in a molecule. As examples of such crosslinking groups, an epoxy group, thiiranyl group, oxetanyl group, and vinyl ether group can be given. Specifically, the component (C) is an epoxy compound, oxetane compound, thiirane compound, or vinyl ether compound. A mixture of these compounds can also be used as the component (C). The component (C) cationically polymerizes by exposure to activation radiation, thereby curing the composition at the exposed area. Moreover, the component (C) crosslinks by heat during post bake, whereby insulating layers exhibiting high heat resistance can be obtained.

Epoxy compound

As the epoxy compounds used as the component (C), a compound containing two or more epoxy groups in a molecule can be given. Other functional groups except for an epoxy group may be contained in such epoxy compounds. Although there are no specific limitations to the molecular weight of these epoxy compounds, epoxy compounds having a molecular weight of 70–20,000 are usually used.

Examples of such epoxy compounds include glycidyl acrylate, glycidyl methacrylate, 3,4-epoxycyclohexyl acrylate, 3,4-epoxycyclohexyl methacrylate; polymers of these compounds; copolymers of these epoxy compounds and other polymerizable monomers such as styrene, methyl methacrylate, hydroxyethyl methacrylate, butadiene, and butyl acrylate; various epoxy resins; and the like.

Of these epoxy compounds, epoxy resins are preferable. As examples of epoxy resins, glycidyl ether-type epoxy resins represented by bisphenol-type epoxy resins, novolak-type epoxy resins, cresol novolak-type epoxy resins, and the like, glycidyl ester-type epoxy resins, aromatic glycidyl amine-type epoxy resins, alicyclic epoxy resins, heterocyclic epoxy resins, liquid rubber-modified epoxy resins, and the like can be given.

Oxetane compound

Oxetane compounds which contain one or more oxetane structures of the following formula (1) can be used as the component (C).

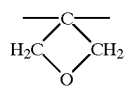
(1)

As examples of such oxetane compounds, compounds of the following formulas (A)–(C) can be given:

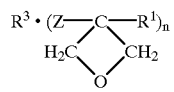
(A)

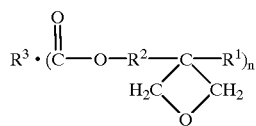
(B)

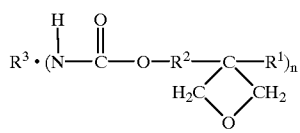
(C)

in the above formulas (A)–(C), n is equal to the valence of $R^3$, specifically, an integer from 1–4; and "." is a bonding hand of the number n, Z is a group represented by $-R^2$, $-R^2O-$, $-OR^2-$, or $-R^2OR^2-$; $R^1$ is an alkyl group such as a methyl group, ethyl group, or propyl group; $R^2$ is an alkylene group such as a methylene group, ethylene group, or propylene group; $R^3$ is an alkyl group such as a methyl group, ethyl group, propyl group, or hexyl group, an aryl group such as a phenyl group or a xylyl group, a dimethylsiloxane residual group of the following formula (2),

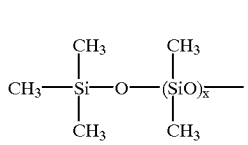
(2)

wherein x is an integer from 0–50, an alkylene group such as a methylene group, ethylene group, or propylene group, a phenylene group, or groups of the following formulas (3)–(7),

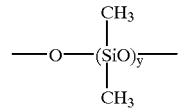
(3)

wherein y is an integer from 1–50,

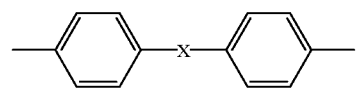
(4)

wherein X is a single bond or divalent groups represented by $-CH_2-$, $-C(CH_3)_2-$, $-C(CF_3)_2-$, $-SO_2-$, $-O-$, $-CO-$, or $-CH(CH_3)-$, (5)

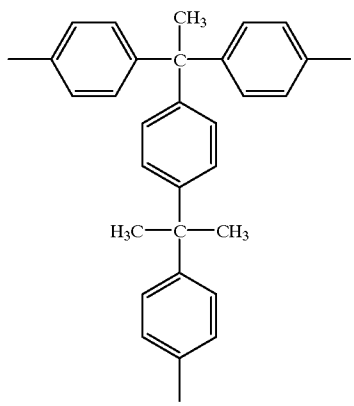

(6)

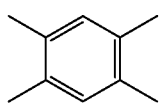

(7)

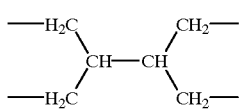

As specific examples of the compounds of the formulas (A)–(C), bis[(3-ethyl-3-oxetanylmethoxy)methyl]benzene (xylylenedioxetane or XDO™, manufactured by Toagosei Co., Ltd.), bis[(3-ethyl-3-oxetanylmethoxy) methylphenyl]methane, bis[(3-ethyl-3-oxetanylmethoxy)methylphenyl]ether, bis[(3-ethyl-3-oxetanylmethoxy)methylphenyl]propane, bis[(3-ethyl-3-oxetanylmethoxy)methylphenyl]sulfone, bis[(3-ethyl-3-oxetanylmethoxy)methylphenyl]ketone, bis[(3-ethyl-3-oxetanylmethoxy)methylphenyl]hexafluoropropane, tri[(3-ethyl-3-oxetanylmethoxy)methyl]benzene, tetra[(3-ethyl-3-oxetanylmethoxy)methyl]benzene, (3-ethyl-3-oxetanylmethoxy)oligodimethylsiloxane of the following formula (D), (D)

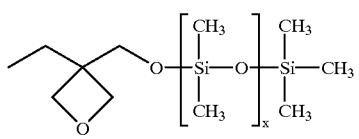

wherein x is an integer from 0–50,

α, ω-(3-ethyl-3-oxetanylmethoxy)oligodimethylsiloxane of the following formula (E), (E)

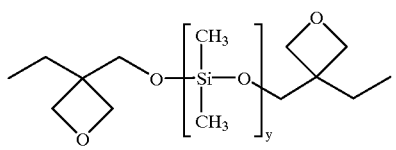

wherein y is an integer from 1–50, 2,3-di[(3-ethyl-3-oxetanylmethoxy)methyl]-1,4-di(3-ethyl-3-oxetanylmethoxy)butane of the following formula (F), (F)

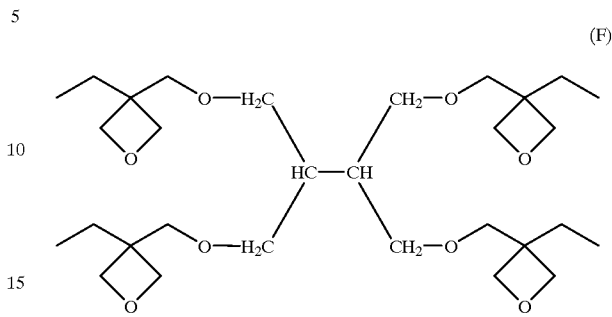

and compounds of the following formulas (G)–(K) can be given.

(G)

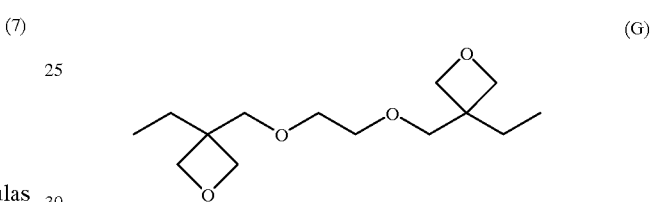

(H)

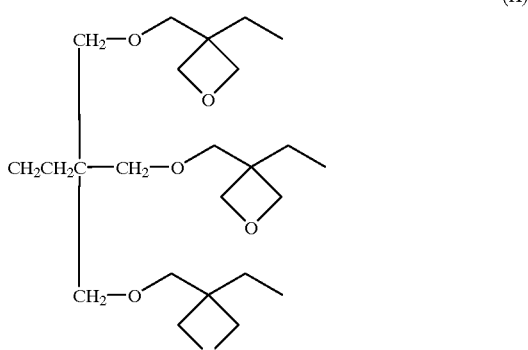

(I-1)

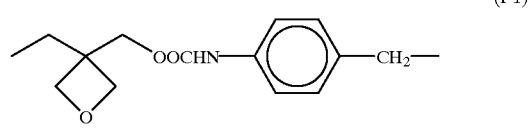

(I-2)

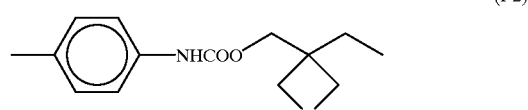

(J)

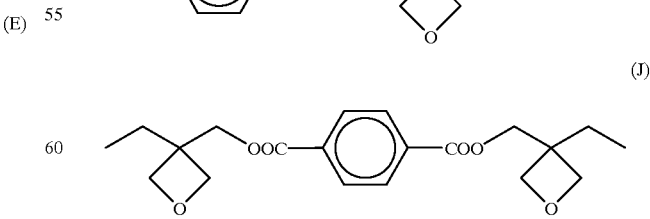

(K)

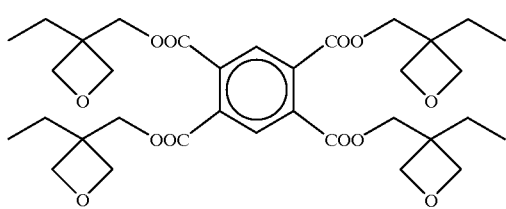

Compounds having a polyvalent oxetane ring with a high molecular weight can be used as the component (C) in addition to the compounds of the formulas (A)–(C). As specific examples of such compounds, oxetane oligomer (Oligo-OXT™, manufactured by Toagosei Co., Ltd.), compounds of the following formulas (L)–(N), and the like can be given;

(L)

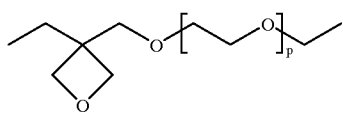

(M)

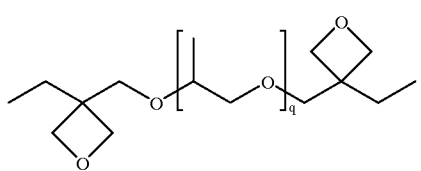

(N)

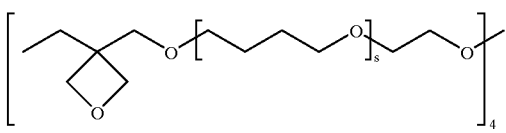

wherein p, q, and s are integers from 1–10,000.

Thiirane compound

Thiirane compounds be used as the component (C) contains two or more thiiranyl groups in a molecule. Such thiirane compounds may contain other functional groups. Although there are no specific limitations to the molecular weight of the thiirane compounds, thiirane compounds having a molecular weight of 70–20,000 are usually used as the component (C). These thiirane compounds are generally synthesized by replacing an oxygen atom in an oxirane ring of oxirane compounds with a sulphur atom, for example, by using a thiocyanate (see, for example, J. M. Charlesworth J. Polym. Sc. Polym. Phys. 17 329 (1979)) or by using a thiourea (see, for example, R. D. Schuetz et al., J. Org. Chem. 26 3467 (1961)). Moreover, a method of using a cyclic carbonate has been proposed (see, for example, S. Seales et al. J. Org. Chem., 27 2832 (1962)). Of synthesizable thiirane compounds given in Table 1 of M. Sander, Chem. Rev. 66 297 (1966), as specific examples of the thiirane compounds of the present invention, thiirane compounds obtained by substituting an oxygen atom in an oxirane ring of oxirane ring-containing compounds with a sulphur atom can be given. Examples of such oxirane ring-containing compounds include: glycidyl acrylate, glycidyl methacrylate, 3,4-epoxycyclohexyl acrylate, 3,4-epoxycyclohexyl methacrylate; polymers of these epoxy compounds; copolymers of these epoxy compounds and other polymerizable monomers such as styrene, butadiene, methyl methacrylate, butyl acrylate, and hydroxyethyl methacrylate; glycidyl ether-type epoxy resins represented by bisphenol-type epoxy resins, novolak-type epoxy resins, cresol novolak-type epoxy resins, and the like; glycidyl ester-type epoxy resins; aromatic glycidyl amine-type epoxy resins; alicyclic epoxy resins; heterocyclic epoxy resins; liquid rubber-modified epoxy resins; and the like.

The proportion of the component (C) used in the composition of the present invention is 8–60 wt %, and preferably 0–50 wt %, of the total amount of the components (A)–(C). If the proportion is too small, the cured resin may exhibit insufficient hardness and decreased heat resistance. On the other hand, if the proportion is too large, alkali developability of the cured resin may be inferior.

Component (D)

The component (D), which acts as a photopolymerization initiator, is a halomethyl-1,3,5-triazine compound of the following formulas (O)–(Q);

(O)

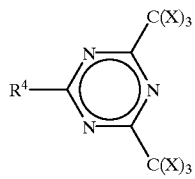

wherein X is a halogen atom and $R^4$ represents $C(X)_3$, an alkyl group, the groups of the following formulas:

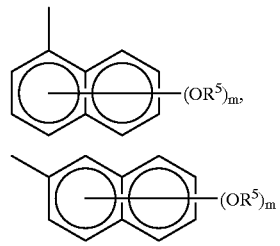

wherein $R^5$ is an alkyl group and m is an integer of 0–2,

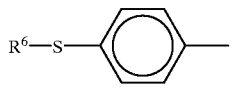

wherein $R^6$ is an alkyl or phenyl group,

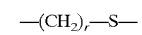

wherein r is 0 or 1,

-continued

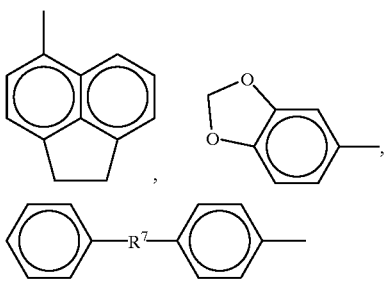

wherein $R^7$ is —O—, —S—, —CH$_2$—, —C(CH$_3$)$_2$—, —C(CF$_3$)$_2$—, or —SO$_2$—, or

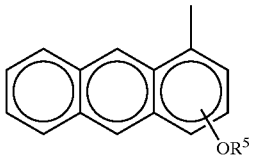

wherein $R^5$ is an alkyl group;

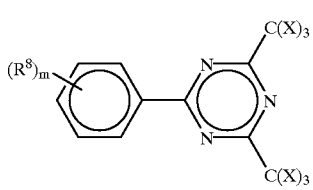

(P)

wherein X is a halogen atom, $R^8$ is an alkyl group, alkoxy group, hydroxyl group, halogen atom, carboxyl group, alkoxycarbonyl group, fluoroalkyl group, —(CH$_2$COOR$^5$)$_2$ (wherein $R^5$ is an alkyl group), —NHCH$_2$CH$_2$X, or —(CH$_2$CH$_2$X)$_2$, and m is an integer of 0–2; or

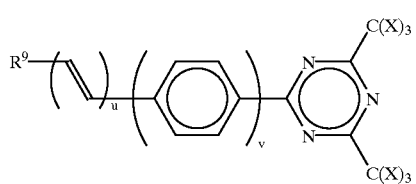

(Q)

wherein X is a halogen atom, u is an integer from 1 to 3, and v is 0 or 1, $R^9$ represents either the following group (a), (b), or (c):

(a)

(wherein $R^{10}$ is a hydrogen atom, halogen atom, alkyl group, alkoxy group, cyano group, —N(C$_2$H$_5$)$_2$—, or

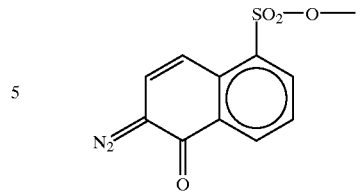

w is an integer from 0 to 2),

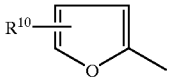

(b)

wherein $R^{10}$ is the same as defined above, or

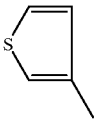

(c)

As examples of the alkyl group in the above formulas (O)–(Q), a methyl group, ethyl group, propyl group, butyl group, pentyl group, hexyl group, heptyl group, octyl group, nonyl group, and the like can be given. Alkyl groups of alkoxy groups, alkoxy carbonyl groups, and flurorine-containing alkyl groups are the same as defined above. As examples of a halogen atom, Cl, Br, F, and the like can be given.

Specific examples of these trihalomethyl-1,3,5-triazine compounds of the above formulas (O)–(Q) are given below together with the CAS (Chemical Abstract Service) registry number (underlined).

107319-57-3 4-[4,6-bis(trichloromethyl)-1,3,5-triazin-2-yl] phenol 110700-28-2 2-[(4-(phenylethynyl)phenyl]-4,6-bis (trichloromethyl)-1,3,5-triazine 112250-52-9 2-{4-[2-(3-thienyl)ethenyl]phenyl}-4,6-bis (trichloromethyl)-1,3,5-triazine 112250-53-0 2-{4-[(4-(1-methylethyl)phenyl)ethynyl] phenyl}-4,6-bis(trichloromethyl)-1,3,5-triazine 113714-29-7 4-{2-[4,6-bis(trichloromethyl)-1,3,5-triazin-2-yl]ethenyl}phenyl-6-diazo-5,6-dihydro-5-oxo-1-naphthalene sulfonate 115043-24-8 4-{2-[4,6-bis(trichloromethyl)-1,3,5-triazin-2-yl]ethenyl}2-methoxyphenol 115168-59-7 N-{4-[4,6-bis(trichloromethyl)-1,3,5-triazin-2-yl]phenyl}-N-(2-ethoxy-2-oxoethyl)glycine ethyl ester 115168-62-2 4-[4,6-bis(trichloromethyl)-1,3,5-triazin-2-yl]-N,N-bis(2-chloroethyl)benzeneamine 115168-63-3 4-[4,6-bis(trichloromethyl)-1,3,5-triazin-2-yl]-N,N-bis(2-chloroethyl)-3-methylbenzeneamine 115168-64-4 4-[4,6-bis(trichloromethyl)-1,3,5-triazin-2-yl]-N—(2-chloroethyl)benzeneamine 115168-69-9 N-{4-[4,6-bis(trichloromethyl)-1,3,5-triazin-2-yl]-2-bromophenyl}-N-(2-ethoxy-2-oxoethyl)glycine ethyl ester 117482-71-0 2-[4-(methylthio)phenyl]-4,6-bis (trichloromethyl)-1,3,5-triazine 117482-72-1 2-[4-(ethylthio)phenyl]-4,6-bis (trichloromethyl)-1,3,5-triazine 117482-73-2 2-[4-(octadecylthio)phenyl]-4,6-bis(trichloromethyl)-1,3,5-triazine
117482-74-3 2-[4-(phenylthio)phenyl]-4,6-bis(trichloromethyl)-1,3,5-triazine
117482-75-4 2-[4-(methylthio)phenyl]-4,6-bis(tribromomethyl)-1,3,5-triazine
120028-36-6 1-{4-[4,6-bis(trichloromethyl)-1,3,5-triazin-2-yl]phenyl}ethanone
121172-84-7 disodium N-{4-[4,6-bis(trichloromethyl)-1,3,5-triazin-2-yl]phenyl}-N-(carboxymethyl)glycine
121198-23-0 disodium N-{4-[4,6-bis(trichloromethyl)-1,3,5-triazin-2-yl]bromophenyl}-N-(carboxymethyl)glycine
122063-53-0 disodium N-{4-[4,6-bis(trichloromethyl)-1,3,5-triazin-2-yl]-2-bromophenyl}-N-(carboxymethyl)glycine
122108-19-4 N-{4-[4,6bis(trichloromethyl)-1,3,5-triazin-2-yl]bromophenyl}-N-(2-ethoxy-2-oxoethyl)glycine ethyl ester
124208-20-4 2-{4-[(1,1-dimethylethyl)thio]phenyl}-4,6-bis(trichloromethyl)-1,3,5-triazine
125407-19-4 2,4-bis(trichloromethyl)-6-[4-trifluoromethyl phenyl]-1,3,5-triazine
125775-49-7 methyl 4-[4,6-bis(trichloromethyl)-1,3,5-triazin-2-yl]benzoate
125775-50-0 4-[4,6-bis(trichloromethyl)-1,3,5-triazin-2-yl]benzoic acid
125775-53-3 3-[4,6-bis(trichloromethyl)-1,3,5-triazin-2-yl]benzoyl chloride
125775-54-4 methyl 3-{4-[4,6-bis(trichloromethyl)-1,3,5-triazin-2-yl]phenyl}2-propionate
125775-55-5 3-{4-[4,6-bis(trichloromethyl)-1,3,5-triazin-2-yl]phenyl}-2-propionic acid
125775-93-1 2-{4-[2-(5-(3,5-dimethoxyphenyl)-1,3,4-oxadiazol-2-yl)ethenyl]phenyl}-4,6-bis(trichloromethyl)-1,3,5-triazine
125775-98-6 methyl 3-[4,6-bis(trichloromethyl)-1,3,5-triazin-2-yl]benzoate
125775-99-7 3-{4-[4,6-bis(trichloromethyl)-1,3,5-triazin-2-yl]phenyl}-2-propenoyl chloride
125899-46-9 1-{3-[4,6-bis(trichloromethyl)-1,3,5-triazin-2-yl)phenyl}-2-(3-ethyl-2(3H)-benzothiazolylideneethanone
151052-45-8 2-[2-(2-methoxyphenyl)ethenyl]-4,6-bis(trichloromethyl)-1,3,5-triazine
22279-01-2 4-[4,6-bis(trichloromethyl)-s-triazin-2-yl]-1-piperazineethanol
24481-36-5 2-nonyl-4,6-bis(trichloromethyl)-s-triazine
24481-45-6 2-(2-naphthalenyl)-4,6-bis(trichloromethyl)-s-triazine
24481-46-7 2-(1-naphthalenyl)-4,6-bis(trichloromethyl)-s-triazine
24481-49-0 2-(4-bromophenyl)-4,6-bis(trichloromethyl)-s-triazine
24502-22-1 2-phenyl-4,6-bis(trichloromethyl)-1,3,5-triazine
31353-42-1 2-isocyanato-4,6-bis(trichloromethyl)-1,3,5-triazine
3584-22-3 2-(4-methylphenyl)-4,6-bis(trichloromethyl)-1,3,5-triazine
3584-23-4 2-(4-methoxyphenyl)-4,6-bis(trichloromethyl)-1,3,5-triazine
42573-57-9 2-[2-(4-methoxyphenyl)ethenyl]-4,6-bis(trichloromethyl)-1,3,5-triazine
42880-03-5 2-(2-phenylethenyl)-4,6-bis(trichloromethyl)-1,3,5-triazine
42880-04-6 2-(4-phenyl-1,3-buthadienyl)-4,6-bis(trichloromethyl)-1,3,5-triazine
42880-05-57 2-(2-(4-chlorophenyl)ethenyl]-4,6-bis(trichloromethyl)-1,3,5-triazine
42880-06-8 2-[2-(4-methylphenyl)ethenyl]-4,6-bis(trichloromethyl)-1,3,5-triazine
42880-07-9 2-[2-(3,4-dimethoxyphenyl)ethenyl]-4,6-bis(trichloromethyl)-1,3,5-triazine
42880-08-0 2-[2-(2,4-dimethoxyphenyl)ethenyl]-4,6-bis(trichloromethyl)-1,3,5-triazine
42880-09-1 2-[2-(4-diethylaminophenyl)ethenyl]-4,6-bis(trichloromethyl)-1,3,5-triazine, or 4-{2-[4,6-bis(trichloromethyl)-1,3,5-triazin-2-yl]ethenyl}-N,N-dimethylbenzeneamine)
42880-10-4 4-{4-[4,6-bis(trichloromethyl)-1,3,5-triazin-2-yl]-1,3-buthadienyl}-N,N-dimethylbenzeneamine
42880-11-5 4-{6-[4,6-bis(trichloromethyl)-1,3,5-triazin-2-yl]-1,3,5-hexatrienyl}-N,N-dimethylbenzeneamine
42880-12-6 2-{2-[4-(pentyloxy)phenyl]ethenyl}-4,6-bis(trichloromethyl)-1,3,5-triazine
42880-13-7 2-{3-[4,6-bis(trichloromethyl)-1,3,5-triazin-2-yl]-2-propenylidene}-3-ethyl-2,3-dihydrobenzoxazole
42880-14-8 3-{2-[4,6-bis(trichloromethyl)-1,3,5-triazin-2-yl]ethenyl}-2-(4-methoxyphenyl)-1-methyl-1H-indole
42880-15-9 4-[2-(4-methoxyphenyl)ethenyl]-6-(trichloromethyl)-1,3,5-triazine-2-amine
5516-47-2 2-(phenylthio)-4,6-bis(trichloromethyl)-1,3,5-triazine
5516-51-8 2-(benzylthio)-4,6-bis(trichloromethyl)-1,3,5-triazine
6542-67-2 2,4,6-tris(trichloromethyl)-1,3,5-triazine
69432-40-2 2-(4-methoxy-1-naphthalenyl)-4,6-bis(trichloromethyl)-1,3,5-triazine
69432-41-3 2-(4-ethoxy-1-naphthalenyl)-4,6-bis(trichloromethyl)-1,3,5-triazine
69432-42-4 2-(4,7-dimethoxy-1-naphthalenyl)-4,6-bis(trichloromethyl)-1,3,5-triazine
69432-43-5 2-[4-(2-ethoxyethoxy)-1-naphthalenyl]-4,6-bis(trichloromethyl)-1,3,5-triazine
69432-44-6 2-(1-methoxy-2-naphthalenyl)-4,6-bis(trichloromethyl)-1,3,5-triazine
69432-45-7 2-(3-methoxy-2-naphthalenyl)-4,6-bis(trichloromethyl)-1,3,5-triazine
69432-46-8 2-(6-methoxy-2-naphthalenyl)-4,6-bis(trichloromethyl)-1,3,5-triazine
69432-47-9 2-(6-methoxy-5-methyl-2-naphthalenyl)-4,6-bis(trichloromethyl)-1,3,5-triazine
69432-49-1 2-(5-methoxy-1-naphthalenyl)-4,6-bis(trichloromethyl)-1,3,5-triazine
69432-53-7 2-(1,1'-biphenyl)-4-yl-4,6-bis(trichloromethyl)-1,3,5-triazine
71255-78-2 2-(1,3-benzodioxol-5-yl)-4,6-bis(trichloromethyl)-1,3,5-triazine
72614-68-7 N,N-dimethyl-4-{4-[4-(trichloromethyl)-1,3,5-triazin-2-yl]-1,3-buthadienyl}benzeneamine
74217-63-3 2-(4-methoxy-1-anthracenyl)-4,6-bis(trichloromethyl)-1,3,5-triazine
79285-14-6 2-(4-butoxyphenyl)-4,6-bis(trichloromethyl)-1,3,5-triazine
79771-30-5 2-{4-[2-(4,6-bis(trichloromethyl)-1,3,5-triazin-2-yl) ethenyl]phenoxy}ethanol
80050-81-9 2-(3,4-dimethoxyphenyl)-4,6-bis(trichloromethyl)-1,3,5-triazine
82721-52-6 2-(1,2-dihydro-5-acenaphthylenyl)-4,6-bis(trichloromethyl)-1,3,5-triazine
949-42-8 2-methyl-4,6-bis(trichloromethyl)-1,3,5-triazine
97802-68-1 2-[2-(4-phenylethyl)phenyl]-4,6-bis(trichloromethyl)-1,3,5-triazine
97802-70-5 2-{4-[2-(4-methoxyphenyl)ethenyl]phenyl}-4,6-bis(trichloromethyl)-1,3,5-triazine 97802-71-6 2-{4-[2-(4-methylphenyl)ethenyl]phenyl}-4,6-bis(trichloromethyl)-1,3,5-triazine 97802-72-7 2-{4-[2-(4-chlorophenyl)ethenyl]phenyl}-4,6-bis(trichloromethyl)-1,3,5-triazine 97802-84-1 2-[4-(2-phenylethenyl)phenyl]-4,6-bis(trichloromethyl)-1,3,5-triazine Not registered 2-[2-(5-methylfuran-2-yl)ethenyl]-4,6-bis(trichloromethyl)-1,3,5-triazine Not registered 2-[2-(furan-2-yl)ethenyl]-4,6-bis(trichloromethyl)-1,3,5-triazine Of these, the following halomethyl-1,3,5-triazine compounds are preferable.

3584-23-4 2,4-bis(trichloromethyl)-6-(4-methoxyphenyl)-1,3,5-triazine 69432-40-2 2-(4-methoxy-1-naphthalenyl)-4,6-bis(trichloromethyl)-1,3,5-triazine 71255-78-2 2-(1,3-benzodioxol-5-yl)-4,6-bis(trichloromethyl)-1,3,5-triazine 80050-81-9 2-(3,4-dimethoxyphenyl)-4,6-bis(trichloromethyl)-1,3,5-triazine 42880-07-9 2-[2-(3,4-ethoxyphenyl)ethenyl]-4,6-bis(trichloromethyl)-1,3,5-triazine 42880-08-0 2-[2-(2,4-dimethoxyphenyl)ethenyl]-4,6-bis(trichloromethyl)-1,3,5-triazine 42573-57-9 2-[2-(4-methoxyphenyl)ethenyl]-4,6-bis(trichloromethyl)-1,3,5-triazine 151052-45-8 2-[2-(2-methoxyphenyl)ethenyl]-4,6-bis(trichloromethyl)-1,3,5-triazine 42880-12-6 2-[2-(4-heptyloxy)ethenyl]-4,6-bis(trichloromethyl)-1,3,5-triazine 42880-09-1 2-[2-(4-diethylamino)ethenyl]-4,6-bis(trichloromethyl)-1,3,5-triazine (another name: 4-{2-[4,6-bis(trichloromethyl)-1,3,5-triazin-2-yl]ethenyl}-N,N-dimethylbenzeneamine)

The proportion of the component (D) used in the composition of the present invention is usually 0.05–3 parts by weight, and preferably 0.1–1.5 parts by weight, for 100 parts by weight of the total amount of the components (A)–(C). If the proportion is too small, the exposed area of the composition may exhibit insufficient curing due to poor sensitivity. On the other hand, if the proportion is too large, the component (D) may exhibit inferior compatibility with the other components and larger light absorption at the film surface, thereby causing inadequate cure depth of the composition.

Other components and additives

Rubber components, solvents, and additives such as adhesion adjuvants, fillers, coloring agents, viscosity controlling agents, leveling agents, and antifoaming agents can be added to the radiation sensitive composition of the present invention, as required.

Rubber components such as a liquid rubber and crosslinking rubber particles can be added to the composition of the present invention in order to increase adhesion and hardness, or to accelerate formation of a roughened cured surface. These rubber components have to exhibit high compatibility and high affinity with the components (A)–(D). If rubber components exhibiting low compatibility and low affinity with the other components are used, the resulting composition may exhibit tackiness, insufficient hardness, inferior formation of a roughened surface, and the like.

As examples of such liquid rubbers and crosslinking rubber particles, various conventional synthetic rubbers can be given. Of these rubbers, an acrylic rubber (ACM), acrylonitrile-butadiene rubber (NBR), and acrylonitrile-acrylate-butadiene rubber (NBA) are preferable with respect to high compatibility and high affinity with the component (A) and the like. Furthermore, synthetic rubbers having at least one functional group selected from an epoxy group, hydroxyl group, carboxyl group, and amino group can optionally be used. In view of practical application, synthetic rubbers having an epoxy group or a carboxyl group are preferable, and synthetic rubbers having a carboxyl group are more preferable.

The above-described liquid rubbers can be prepared by any conventional method including an emulsion polymerization method, solution polymerization method, bulk polymerization method, suspension polymerization method, and the like. Such a polymerization can be carried out by either a batch process or a continuous process. Liquid rubbers thus obtained contain ion components. In the present invention, liquid rubbers containing a small amount of ion components are preferred for providing high electrical insulation for the resulting insulating layers. If diene monomers are used in the monomer composition for preparing the liquid rubbers, such a monomer composition can be easily polymerized by emulsion polymerization. In particular, according to an emulsion polymerization method disclosed in Japanese Patent Application Laid-open No. 74908/1987, liquid rubbers containing only a small amount of ion components can be prepared.

In addition, as crosslinking rubber particles, particles having a particle diameter of 10–1,000 nm can be preferably used.

Solvents can be used in the composition of the present invention in order to improve coatability, homogeneity, and the like of the composition. As examples of solvents, solvents having a high boiling point such as N-methylformamide, N,N-dimethylformamide, N-methylformamide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, ethyl lactate, diethyl oxalate, diethyl maleate, γ-butyrolactone, cyclohexanone, ethylene carbonate, propylene carbonate, phenylcellosolve acetate, methoxymethyl propionate, ethoxyethyl propionate, diethylene glycol dimethyl ether, diethylene glycol methylethyl ether, triethylene glycol dimethyl ether, and triethylene glycol methylethyl ether can be given. The proportion of these solvents used in the composition can be varied in accordance with the applications of the composition or the application methods. Although there are no specific limitations to such a proportion inasmuch as a homogeneous composition can be prepared, these solvents are used in the proportion of usually 5–60 wt %, and preferably 10–40 wt %, of the resulting liquid composition.

Adhesion adjuvants can be added to the composition of the present invention in order to increase adhesion to the substrates to which the composition is applied. As adhesion adjuvants, functional silane coupling agents containing reactive substituents such as a carboxyl group, methacryloyl group, isocyanate group, and epoxy group can suitably be used. As examples of such functional silane coupling agents, trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl)ethyltrimethoxysilane, and the like can be given. The proportion of these functional silane coupling agents to be used is preferably 2 parts by weight or less for 100 parts by weight of the composition.

Other additives such as fillers, coloring agents, viscosity controlling agents, leveling agents, and antifoaming agents can be added to the composition of the present invention. As examples of fillers, silica, alumina, talc, calcium carbonate, bentonite, zirconium silicate, powdery glass, and the like can be given. As examples of coloring agents, extenders such as alumina white, clay, barium carbonate, and barium sulfate; inorganic pigments such as zinc white, white lead, chrome yellow, red lead, ultramarine blue pigment, iron blue pigment, titanium oxide, zinc chromate, red iron oxide, and carbon black; organic pigments such as brilliant carmin 6B, permanent red 6B, permanent red R, benzidine yellow, phthalocyanine blue, and phthalocyanine green; basic dyes such as magenta and Rhodamine; direct dyes such as direct scarlet and direct orange; acidic dyes such as rhocerin and metanil yellow; and the like can be given. As examples of viscosity controlling agents, bentonite, silica gel, aluminum powder, and the like can be given. As examples of leveling agents, silicone compounds, polyalkylene oxide compounds, and the like can be given. As examples of antifoaming agents, compounds having a low surface tension such as silicon-containing compounds and fluorine-containing compounds can be given. These additives are added in such proportions that the essential characteristics of the composition are not impaired. Specifically, the proportion of these additives is 50 wt % or less of the total amount of the composition.

Preparation of composition

If fillers or pigments are not used in the composition of the present invention, the composition can be prepared by mixing each component while stirring according to a conventional method. If the composition contains fillers or pigments, the composition can be prepared by dispersing and mixing the components by using a dispersing apparatus such as a dissolver, homogenizer, or three-roller mill. Moreover, the composition can be filtered through a mesh, membrane filter, or the like, as required.

Application of composition

The composition of the present invention is used, for example, for forming insulating layers in the manufacture of multilayered wiring boards. The manufacture of multilayered wiring boards by using the composition of the present invention is as follows. An insulating thin film formed from the composition according to the above coating method is applied on the surface of a wiring board with conductor wiring formed thereon. This thin film is exposed to radiation and developed using a developer to form through-holes connecting, for example, to the above conductor wiring on the unexposed area of the thin film, thereby exposing the conductor wiring on the thin film at the unexposed area. Additional conductor wiring in contact with the above conductor wiring is then formed on the surface of the thin film. In the manufacture of multilayered wiring boards, the above process may be repeated one or more times. Specifically, the composition of the present invention is applied on the surface of a wiring board with conductor wiring sets of the number n (here, n is an integer of 1 or more) formed thereon to form an insulating layer. Conductor wiring sets of the number (n+1) which electrically connect to the conductor wiring sets of the number n are then formed on the surface of this insulating layer by plating and the like. This process may be repeated two or more times.

The manufacturing method for multilayered wiring boards by using the composition of the present invention will be described in more detail in the order of each step.

(1) Formation of thin film

In this step, the composition of the present invention is applied, for example, on the surface of a wiring board with conductor wiring formed thereon so that said conductor wiring is covered with the composition. The solvent in the composition is then removed by heating and drying the surface of the composition to form a thin film.

There are no specific limitations to the materials of the substrates on which conductor wiring is formed. For example, a glass epoxy resin, paper phenol resin, ceramic, glass, and silicone wafer can be given as examples of such materials. There are no specific limitations to the application method for the composition, and conventional methods of applying photosensitive materials, for example, screen printing, roller-mill coating, bar coating, dip coating, curtain coating, slit-die coating, spin coating, applicator method, and the like can be exemplified. Moreover, such a thin film may be formed by preparing a dry film by casting the composition of the present invention onto a base film to form a film, drying the cast film, and applying the dried film to the substrates by using a laminator or the like. In this case, as examples of such a base film, translucent films, for example, polyester films such as polyethyleneterephthalate and polybutyleneterephthalate and polyolefin films such as oriented polypropylene and polystyrene can preferably be used. In addition, if such a translucent film is used as the base film, the thin film can be cured by exposure to radiation via this base film.

Although the drying conditions of the composition may vary in accordance with the type and the blending ratio of each component, film thickness, or the like, the composition is usually dried at 70–130° C. for about 5–20 minutes. The thin film is dried by using an oven, hot plate, and the like. If the thin film is insufficiently dried, the surface of the thin film may become sticky due to the residual solvents and the resulting insulating layer may exhibit decreased adhesion to substrates. On the other hand, if overdried, low resolution of the thin film may be caused by overheating during a developing operation.

The thickness of the dried thin film thus obtained is usually 10–100 $\mu$m, and preferably 30–70 $\mu$m. If the thickness is insufficient, the resulting insulating layer may exhibit insufficient electrical insulation. On the other hand, if the thickness is too great, resolution of the insulating layer may be low.

(2) Exposure

In this step, the thin film formed on a wiring board in the preceding step is exposed to radiation such as ultraviolet rays with a wavelength of 200–500 nm or visible rays, for instance, via a mask having a specified pattern to cure the irradiated area (exposed area) of the thin film. As a pattern exposure system, fusion, a contact aligner, stepper, mirror projector, or the like can be used. As a light source for irradiation, for example, a low pressure mercury lamp, high pressure mercury lamp, ultra-high pressure mercury lamp, metal halide lamp, argon gas laser, X-ray generator, and electron beam generator can be used. A dose of radiation applied to the thin film may vary according to the type and blending ratio of each component used in the composition, film thickness, and the like. For example, if a high pressure mercury lamp is used for the light source, the thin film is irradiated at a dose of 100–1,500 mJ/cm$^2$.

(3) Heating for cure acceleration

In this step, the thin film after exposure is heated usually for about 3–60 minutes at 70–130° C. for accelerating curing of the thin film by a thermal reaction in addition to curing by the reaction in the exposure step. This heating step is carried out by using a conventional equipment such as an oven or a hot plate. If the thin film is heated too much, resolution of the thin film may be decreased by overheating.

(4) Development

In this step, the composition on the unexposed area of the thin film is removed by dissolving the composition in a developer which is an alkaline aqueous solution, whereby a pattern consisting of the cured composition remaining on the exposed area is formed.

As examples of such a developer, aqueous solutions of alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethyl alcohol amine, triethyl alcohol amine, tetramethyl ammonium hydroxide, tetraethyl ammonium hydroxide, pyrrole, piperidine, 1,8-diazabicyclo [5.4.0]-7-undecene, and 1,5-diazabicyclo [4.3.0]-5-nonane can be given. Moreover, aqueous solutions in which an appropriate amount of water-soluble organic solvents such as methyl alcohol or ethyl alcohol, or surfactants are added to the above alkaline compounds or various organic solvents which can dissolve the composition of the present invention can be used as the developer. Of these, particularly preferred developers are aqueous solutions of sodium hydroxide, potassium hydroxide, sodium carbonate, tetramethyl ammonium hydroxide, or the like with a concentration of 0.1–3.0 wt %, and more preferably 0.5–1.5 wt %.

As a developing method, a puddle developing method, dip developing method, spray developing method, and the like can be given. After the development, the thin film is, for example, rinsed with a running water for 30–90 seconds and then dried by using an air gun or in an oven.

In this development step, part of the thin film is removed to form, for example, through-holes by which part of the conductor wiring applied on the surface of the substrate is exposed, whereby insulating layers having photo-via-holes are obtained.

(5) Heat curing/post exposure

The composition of the present invention has both radiation-curablity and heat-curability. After the development, curing of the insulating layers having photo-via-holes are further accelerated by this heat curing/post exposure step. Therefore, this step can be omitted if the insulating layer is sufficiently cured. Heat curing is carried out by using a hot plate, oven, IR oven, or the like at such a temperature that the insulating layer does not exhibit heat deterioration, preferably at 150–200° C., for about from 30 minutes to 5 hours.

Post exposure is carried out using the same radiation source and apparatus as used in the above-described exposure step at a dose of, for example, 100–1,000 $mJ/cm^2$.

(6) Planerization

This step is optionally carried out for planerizing (or for flattening) the insulating layer formed on, for example, the uneven substrates by polishing. Planerization of the insulating layer ensures high accuracy formation of conductor wiring on the surface of the insulating layer. The insulating layers can be polished by using a buff roll, nylon brush, belt sander and the like.

(7) Formation of through-holes

In this step, through-holes for inserting parts or connecting to other wiring boards, specifically, for achieving an interlayer connection are formed by mechanically drilling the thin film by using a numerical-controlling drilling machine and the like. This step is optionally carried out in the manufacture of multilayered printed boards, because interlayer connections can be achieved by photo-via-holes using the composition of the present invention.

(8) Surface roughening

In this step, the surface of the insulating layer is roughened by using a surface roughening solution in order to improve adhesion of the conductor wiring to the surface of the insulating layer.

As a surface roughening solution, an alkaline solution such as a potassium permanganate aqueous solution, an aqueous solution of potassium permanganate and sodium hydroxide, a solution of mixture of chromic anhydride and sulfuric acid, or other strong acid solutions can be used. Of these, an aqueous solution of potassium permanganate and sodium hydroxide is preferred. The surface of the insulating layer can be roughened by immersing the insulating layer in the surface roughening solution for 5–30 minutes at 50–80° C. After this surface roughening treatment, the surface of the insulating layer should be neutralized with a weak acid aqueous solution such as oxalic acid followed by sufficient rinsing with running water.

By this step, the surface of the insulating layer and the side walls of photo-via-holes or through-holes are roughened by an unevenness of 0.01–10 $\mu$m, thereby providing increased adhesion for the copper plated layers of conductor wiring by an anchoring effect.

(9) Catalyst treatment

This step is performed to cause a plating catalyst to be carried on the surface of the insulating layers and the inner wall surfaces of the holes. Such a plating catalyst acts as precipitation nuclei in the next electroless copper plating step. Metal colloids such as palladium can be used as the plating catalyst. The catalyst can be made to be carried on by immersing the insulating layers in a conventionally known solution in which such metal colloids are dispersed in a dispersion medium. The composition of the present invention may contain such a plating catalyst, in which case this catalyst treatment step can be omitted.

(10) Formation of additional conductor wiring

In this step, additional conductor wiring (secondary conductor wiring) is formed on the surface of the insulating layer while electrically connecting the same to the conductor wiring previously formed on the surface of the substrates (primary conductor wiring) via photo-via-holes or through-holes by, for example, electroless copper plating. As examples of a method for forming such new conductor wiring, the following methods ①–③ can be given.

Method ①:

A copper plated layer is formed by providing electroless copper plating over the whole area of the surface of the insulating layer on which catalysts are carried. After optionally forming a copper metal layer having a desired thickness by electrolytic copper plating using this copper plated layer as an electrode, a resist pattern is formed on this copper metal layer. Then, a conductor pattern is formed by etching this copper metal layer. Here, such a resist pattern is formed on not only on the area where the secondary conductor wiring is formed, but also on the area of photo-via-holes for an interlayer connection where an interlayer connection conductor connecting the primary conductor wiring and the secondary conductor wiring is formed, specifically, the area where a conductor land is formed. It is preferable that the diameter of the conductor land be larger than that of photo-via-holes taking errors due to shift of patterns into consideration. These resist patterns are usually formed by photolithography using a photo resist. The copper metal layer is etched by using an ammonium persulfate aqueous solution or an ammonia complex etchant. After etching the copper metal layer, the resist patterns are removed by a specified delamination method. As a photo resist used in photolithography, photo resists exhibiting adequate resolution and sufficient resistance to etchant and capable of being delaminated can be used. In this manner, the secondary conductor wiring electrically connected to the primary conductor wiring formed on the surface of the substrate is formed on the insulating layer.

Method ②:

A resist pattern is formed on the surface of the insulating layer on which the catalyst is carried, except for the area where a new conductor wiring is to be formed. The surface of the insulating layer is provided with electroless copper plating and optionally electrolytic copper plating to form new conductor wiring and a copper plated layer on the innerwall surface of the photo-via-holes. These resist patterns are then delaminated. In this method, it is also preferable that the width of the conductor wiring be larger than the diameters of the photo-via-holes.

Method ③:

A radiation-sensitive resin composition containing no plating catalyst is applied on the surface of the insulating layer on which catalyst is carried to form a film. This film is exposed to radiation via a pattern mask and then developed to form photo-via-holes, and the part of the film where the secondary conductor wiring is continuously formed is removed. The surface of the insulating layer is provided with only electroless copper plating. It is preferable that the width of the conductor wiring be larger than the diameters of the photo-via-holes in this method. Moreover, the thickness of the film is preferably the same or slightly thicker than that of the copper metal layer formed by copper plating.

According to this method, the secondary conductor wiring is formed on the area where the film is removed and the insulating film consisting of the remaining film is formed on the insulating layer. Moreover, because the thickness of this remaining film is usually close to that of the copper metal layer, secondary conductor wiring having a flat outer surface can be obtained.

The composition of the present invention can be used as the radiation-sensitive resin composition used for forming the above film.

By repeating the above steps (1)–(10), multilayered wiring boards consisting of a further multilayered structure can be obtained. In this case, the new conductor wiring formation step (10) may be carried out by combining the methods ①–③.

In order to increase adhesion of the insulating layers with the conductor wiring, post baking is preferably performed after forming conductor wiring on the surface of upper insulating layer of the multilayered wiring board. Post baking for each insulating layer except for this upper layer and each set of conductor wiring formed thereon is not particularly required because these insulating layers and the conductor wiring are heated through the subsequent heating steps for upper insulating layers.

EXAMPLES

The present invention will now be described by way of Examples, which should not be construed as limiting the present invention. In Examples, "part" and "%" show "parts by weight" and "wt %" respectively unless otherwise indicated.

Component (A)

The following four phenol resins were prepared.

A1: Cresol novolak resin (m-cresol:p-cresol=6:4 (in molar ratio), weight average molecular weight (Mw)=11,000)

A2: Phenol novolak resin (weight average molecular weight (Mw) =6,000)

A3: Poly(p-vinylphenol) (manufactured by MARUZEN PETROCHEMICAL CO., LTD., weight average molecular weight (Mw)=3,000)

A4: Poly(brominated p-vinylphenol) ("Maruka Linker MB", manufactured by MARUZEN PETROCHEMICAL CO., LTD., weight average molecular weight (Mw)=4,000)

Component (B)

The following three amino resins were prepared.

B1: Hexamethoxymethylmelamine ("Cymel 300", manufactured by Mitsui Cytech Co., Ltd.)

B2: Tetramethoxymethyl glycoluril ("Cymel 1170", manufactured by Mitsui Cytech Co., Ltd.)

B3: Benzoguanamine resin ("BX-4000", manufactured by Sanwa Chemical Co., Ltd.)

Component (C)

The following four compounds were prepared.

C1: Bisphenol A type epoxy resin ("Epicoat 828", manufactured by Yuka-Shell Epoxy K.K.)

C2: Novolak type epoxy resin ("EOCN-100", manufactured by Nippon Kayaku Co., Ltd.)

C3: 2,2'-[(1-Methylethylidene)bis(4,1-phenyleneoxymethylene)]bisthiirane

C4: 1,4-Bis[(3-ethyl-3-oxetanylmethoxy)methyl]benzene

Component (D)

The following four photopolymerization initiators were prepared.

D1: 2,4-Trichloromethyl-(4'-methoxyphenyl)-6-triazine

D2: 2,4-Trichloromethyl-(4'-methoxystyryl)-6-triazine

D3: Diphenyliodonium-9,10-dimethoxyanthracene sulfonate

D4: Triphenylsulfonium hexafluorophosphate

Additive

E: Butadiene-acrylonitrile-methacrylic acid copolymer (butadiene:acrylonitrile:methacrylic acid=60:35:5 (in molar ratio); number average molecular weight (Mn)=6,000; glass transition temperature (Tg)=−39° C.)

Solvent

The following two organic solvents were prepared.

MMP: 3-methoxymethyl propionate

PGMEA: propylene glycol monomethyl ether acetate

Examples 1–7 and Comparative Examples 1–4

(preparation of composition)

The components (A)–(D), additives, and solvents were blended according to the formulations of Table 1. The mixtures were mixed using a Henschel mixer to prepare radiation-sensitive resin compositions.

TABLE 1

| | | Component (A) | | Component (B) | | Component (C) | | Component (D) | | Additive (E) | Solvent | |
|---|---|---|---|---|---|---|---|---|---|---|---|---|
| | | Type | Part(s) | Type | Part(s) | Type | Part(s) | Type | Part(s) | Part(s) | Type | Part(s) |
| Example | 1 | A1 | 50 | B2 | 25 | C1 | 25 | D1 | 0.5 | 20 | MMP | 65 |
| | 2 | A1 | 55 | B1 | 10 | C3 | 35 | D2 | 0.5 | 25 | MMP | 65 |
| | 3 | A2 | 55 | B2 | 15 | C2 | 30 | D1 | 1.0 | 15 | PGMEA | 65 |
| | 4 | A2 | 60 | B1 | 23 | C4 | 17 | D2 | 0.5 | 20 | MMP | 65 |
| | 5 | A3 | 55 | B1 | 15 | C1 | 30 | D1 | 1.5 | 20 | MMP | 65 |
| | 6 | A3 | 60 | B2 | 15 | C2 | 25 | D2 | 3.0 | 20 | MMP | 65 |
| | 7 | A4 | 55 | B3 | 20 | C3 | 25 | D1 | 1.5 | 20 | PGMEA | 65 |
| Comparative Example | 1 | A1 | 50 | B2 | 25 | C1 | 25 | D3 | 1.0 | 20 | MMP | 65 |
| | 2 | A2 | 60 | B1 | 23 | C4 | 17 | D3 | 0.5 | 20 | MMP | 65 |
| | 3 | A3 | 55 | B1 | 15 | C1 | 30 | D4 | 0.3 | 20 | PGMEA | 65 |
| | 4 | A4 | 55 | B3 | 20 | C3 | 25 | D4 | 0.5 | 20 | MMP | 65 |

Evaluation of composition and insulating layer and manufacture of multilayered wiring board (1) Preparation and evaluation of substrate for radiation sensitivity test A plate made from a glass epoxy resin with a copper metal layer formed over the surface thereof was used as a test specimen. The compositions prepared in Examples 1–7 and Comparative Examples 1–4 were applied to the surfaces of the above plates using a spin coater. Each composition was dried for 10 minutes at 90° C. in a hot blast oven to form a thin film having a thickness of about 50 μm after drying.

The thin films on the test specimens were exposed via perforated glass masks with perforations having a diameter of 25 μm, 50 μm, 75 μm, 100 μm, 150 μm, or 200 μm. The thin films were irradiated by contact exposure at a dose of 1,000 mJ/cm$^2$ using a contact aligner ("ML-3", manufactured by Mikasa Electric Machine Co., Ltd.).

After exposure, the test specimens were heated for 5 minutes at 120° C. The test specimens were then developed by immersing in a 0.75% tetramethylammonium hydroxide aqueous solution for 180–300 seconds while shaking to form insulating layers having through-holes reaching the copper metal layer, specifically, photo-via-holes. The test specimens on which the insulating layers were formed were rinsed with water and then dried. Developability was evaluated by rating the insulating layer on which through-holes having a diameter of 75 μm were completely formed as "good", and the others as "bad".

The test specimens with the insulating layers formed thereon were then heated for 60 minutes at 150° C. in a hot blast oven to cure. The surfaces of the insulating layers on the test specimens were roughened by immersing the test specimens in a potassium permanganate-sodium hydroxide aqueous solution (concentration of potassium permanganate: 3%, concentration of sodium hydroxide: 2%) for 10 minutes at 65° C. After neutralizing the surfaces of the test specimens by immersing in a 5% oxalic acid aqueous solution for 5 minutes at room temperature, the test specimens were sufficiently rinsed with water.

The conditions of the roughened surface of the test specimens were evaluated by observing the surfaces of the insulating layers using a scanning electron microscope. The case where the surfaces of the insulating layers were finely roughened was rated as "good" and the others were rated as "bad".

The test specimens were immersed in a palladium chloride catalyst solution for 6 minutes at room temperature so that plating catalyst was carried on the roughened surfaces of the insulating layers and through-holes. The test specimens were then immersed in a catalyst activation solution at room temperature for 8 minutes to activate the plating catalyst. After rinsing with water, electroless copper plating was provided for the test specimens for 20 minutes at a room temperature. In this plating treatment, products of the OPC Process M Series (manufactured by OKUNO PHARMACEUTICALS CO., LTD.) were used as a catalyst solution, catalyst activation solution, and electrolysis copper plating solution. Electrolysis copper plating was then provided at a current density of 3.0 mA/dm by using an electrolysis copper plating solution consisting of a copper sulfate-sulfuric acid aqueous solution (copper sulfate concentration: 210 g/L, sulfuric acid concentration: 52 g/L, pH=1.0) to form a copper metal layer having a total thickness of about 20 μm over the surface of the insulating layer. The test specimens were then heated for 1 hour at 150° C.

Peel strength (JIS C 6481) of the copper metal layers was measured by peeling off the surfaces of the test specimens from the edges of the surfaces on which cutting lines at 1 cm intervals were formed, using a peeling tester. The most frequent value measured during a 10 cm peeling was determined as the peel strength. A copper metal layer exhibiting a peel strength of 800 g/cm or more was rated as "good".

(2) Evaluation of electrolytic corrosion resistance

Insulating layers having a thickness of 50 μm were formed on an arch-shaped electrode substrate for electrolytic corrosion evaluation having 100 μm wiring pitches (made from a BT (bismaleimidetriazine) resin, 10×10 cm square) according to the method of the preparation and evaluation of the substrate for the radiation sensitivity test (1) to prepare the substrates for electrolytic corrosion evaluation. The insulation resistance values of the substrates placed in a thermo-hygrostat of 85° C.×85%RH were recorded while continuously charging the substrates with a direct current of 100V. The time until the insulation resistance value drops below 10$^8$ ohms was determined as the electrolytic corrosion resistant time (hr).

These results are shown in Table 2. As is clear from Table 2, each test specimen prepared from the compositions of Examples 1–7 exhibited high developability, good conditions of the roughened surface, and high peel strength, as well as excellent electrolytic corrosion resistance as evident from the long electrolytic corrosion resistance time. On the other hand, although the test specimens prepared from the compositions of Comparative Examples 1–4 exhibited high developability, good surface roughening conditions, and high peel strength, these test specimens exhibited insufficient electrolytic corrosion resistance. Accordingly, electrolytic corrosion resistance was improved without imparing developability, surface roughening conditions, peel strength, and the like by using the composition of the present invention.

TABLE 2

| | Develop-ability | Electrolytic corrosion resistant time (hr) | Condition of roughened surface | Peel strength (g/cm) |
|---|---|---|---|---|
| Example 1 | Good | >1000 | Good | Good |
| Example 2 | Good | >1000 | Good | Good |
| Example 3 | Good | >1000 | Good | Good |
| Example 4 | Good | >1000 | Good | Good |
| Example 5 | Good | >1000 | Good | Good |
| Example 6 | Good | 900 | Good | Good |
| Example 7 | Good | >1000 | Good | Good |
| Comparative Example 1 | Good | 260 | Good | Good |
| Comparative Example 2 | Good | 500 | Good | Good |
| Comparative Example 3 | Good | 460 | Good | Good |
| Comparative Example 4 | Good | 350 | Good | Good |

The radiation-sensitive resin composition of the present invention can be suitably used in the manufacture of multilayered wiring boards since the composition comprises a compound having two or more crosslinking groups such as an epoxy group, oxetanyl group, thiiranyl group, or vinyl ether group in a molecule as an indispensable component, in addition to an alkali-soluble phenol resin and an amino resin. For example, the composition exhibits high resolution by which photo-via-holes having a small diameter can be formed with high accuracy, alkaline aqueous solution developability, superior plating solution resistance, and high adhesion with conductor wiring. Moreover, insulating layers exhibiting high solvent resistance, superior waterproofing characteristics, and good heat resistance can be formed from the composition after curing. Therefore, multilayered wiring boards exhibiting high reliability in electrical insulation can be efficiently manufactured by using the composition of the present invention.

Obviously, numerous modifications and variations of the present invention are possible in light of the above teachings. It is therefore to be understood that within the scope of the appended claims, the invention may be practiced otherwise than as specifically described herein.

What is claimed is:
1. A radiation-sensitive composition, comprising:

(A) a phenol resin;
(B) an amino resin;
(C) a compound having two or more cross-linking groups in a molecule, and which groups are selected from the group consisting of epoxy, thiiranyl, oxetanyl, and vinyl ether; and
(D) a halomethyl-1,3,5-triazine compound which is selected from the group of compounds having either of the following formulae (O) or (Q):

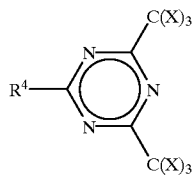
(O)

wherein X is halogen, and $R^4$ represents

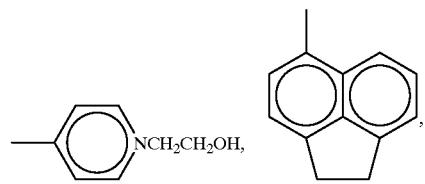

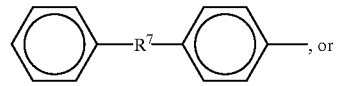

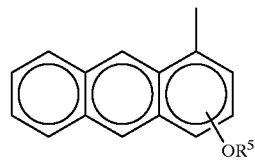

wherein $R^5$ is alkyl; $R^6$ is alkyl or phenyl; r is 0 or 1; and $R^7$ is —O—, —CH$_2$—, —C(CH$_3$)$_2$—, —C(CF$_3$)$_2$—, or —SO$_2$—; or

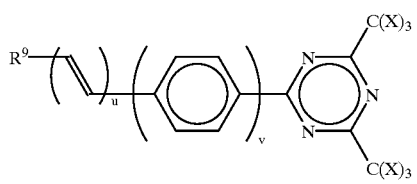
(Q)

wherein X is a halogen atom, u is an integer from 1 to 3, v is 0 or 1, and $R^9$ represents the following group (b), or (c):

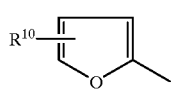
(b)

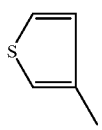
(c)

wherein $R^{10}$ is halogen, cyano, $-N(C_2H_5)_2-$, or

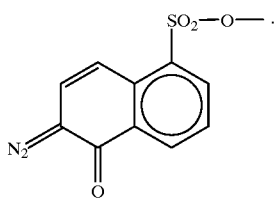

2. The radiation-sensitive resin composition according to claim 1, wherein the phenol resin (A) is a polyvinylphenol or a novolak resin.

3. The radiation-sensitive resin composition according to claim 1, wherein the amino resin (B) is nitrogen-containing compound having two or more active methylol groups in a molecule.

4. The radiation-sensitive resin composition according to claim 1, wherein said nitrogen-containing compound having two or more active methylol groups in a molecule is selected from the group consisting of (poly)methylolbenzoguanamine, and (poly)methylolglycoluril, (poly)methylolbenzoguanamine, and (poly)methylolurea, with the hydrogen atom in the hydroxyl group of the methylol group being either replaced or not replaced by an alkyl group, and a compound containing a partial self-condensation oligomer of these nitrogen-containing compounds.

5. The radiation-sensitive resin composition according to claim 1, wherein the proportion of the component (A) is 30–75 wt % of the total amount of the components (A), (B), and (C).

6. The radiation-sensitive resin composition according to claim 1, wherein the amount of the component (B) used is 10–60 parts by weight for 100 parts by weight of the component (A).

7. The radiation-sensitive resin composition according to claim 1, wherein the proportion of the component (C) is 8–60 wt % of the total amount of the components (A), (B), and (C).

8. The radiation-sensitive resin composition according to claim 1, wherein the proportion of the component (D) is 0.05–3 parts by weight for 100 parts by weight of the total amount of the components (A), (B), and (C).

* * * * *

UNITED STATES PATENT AND TRADEMARK OFFICE
CERTIFICATE OF CORRECTION

PATENT NO.    : 6,190,833
DATED         : February 20, 2001
INVENTOR(S)   : Shiota et al.

It is certified that error appears in the above-identified patent and that said Letters Patent is hereby corrected as shown below:

On the title page, item (30) the Foreign Application Priority Data is incoorect, item (30) should read as follows:

--(30)     Foreign Application Priority Data

Sep. 30, 1997   (JP) ........................................ 9-282694
Apr. 28, 1998   (JP) ........................................ 10-119019--

Signed and Sealed this

Fifth Day of June, 2001

Attest:

NICHOLAS P. GODICI

Attesting Officer

*Acting Director of the United States Patent and Trademark Office*